(12) United States Patent
Rosenblum

(10) Patent No.: US 9,184,073 B2
(45) Date of Patent: Nov. 10, 2015

(54) SUBSTRATE PROCESSING APPARATUS

(71) Applicant: SAMSUNG DISPLAY CO., LTD., Yongin, Gyeonggi-Do (KR)

(72) Inventor: Martin Philip Rosenblum, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 13/794,533

(22) Filed: Mar. 11, 2013

(65) Prior Publication Data
US 2014/0060735 A1 Mar. 6, 2014

(30) Foreign Application Priority Data
Aug. 31, 2012 (KR) .................. 10-2012-0096784

(51) Int. Cl.
H01L 21/67 (2006.01)
C23C 14/56 (2006.01)

(52) U.S. Cl.
CPC ........ H01L 21/67207 (2013.01); C23C 14/568 (2013.01); H01L 21/67155 (2013.01); H01L 21/67161 (2013.01); H01L 21/67173 (2013.01);
(Continued)

(58) Field of Classification Search
CPC .............. H01J 37/32899; H01J 2237/022; H01J 37/32008; H01J 37/32125; H01J 37/32445; H01J 37/32473; H01J 37/32491; H01J 37/32633; H01L 21/6719; H01L 21/6734; H01L 21/67346; H01L 21/677; H01L 21/67703; H01L 21/6773; H01L 21/67739; H01L 21/67742; H01L 21/67745; H01L 21/67748; H01L 21/67754; H01L 21/67763; H01L 21/67769; H01L 21/702; H01L 21/67173; H01L 21/67276; H01L 21/67781; H01L 21/67017; H01L 21/67069; H01L 21/67126; H01L 21/67155–21/67294; H01L 21/67751; C23C 14/568; C23C 16/4401; C23C 16/4412; C23C 16/54; Y10S 414/135; A23G 3/2076; A23G 3/26; A23P 1/083; A61J 3/005; B01J 2/006
See application file for complete search history.

(56) References Cited

U.S. PATENT DOCUMENTS 4,917,556 A * 4/1990 Stark et al. .................... 414/217
5,536,128 A * 7/1996 Shimoyashiro et al. ...... 414/273
(Continued)

FOREIGN PATENT DOCUMENTS

JP H01 500072 A * 1/1989
JP 2003-163082 6/2003
(Continued)

Primary Examiner — Jeffrie R Lund
Assistant Examiner — Stanislav Antolin
(74) Attorney, Agent, or Firm — Christie, Parker & Hale, LLP

(57) ABSTRACT

A substrate processing apparatus is disclosed. The substrate processing apparatus includes: a first process unit including a plurality of first process stations configured to perform a first process in a first atmosphere; a second process unit including a plurality of second process stations configured to perform a second process in a second atmosphere different from the first atmosphere; and a transformation unit between the first process unit and the second process unit. The first process unit, the transformation unit, and the second process unit are arranged in a line. The transformation unit includes a plurality of transformation stations configured to transform an atmosphere between the first atmosphere and the second atmosphere. Thus, the efficiency of processing a substrate can be improved, and the area or length in which the substrate processing apparatus is installed can be reduced.

16 Claims, 6 Drawing Sheets

(52) U.S. Cl.
CPC .... *H01L 21/67184* (2013.01); *H01L 21/67271* (2013.01); *H01L 21/67276* (2013.01)

(56) References Cited

U.S. PATENT DOCUMENTS

| | | | |
|---|---|---|---|
| 5,695,564 A | 12/1997 | Imahashi | |
| 6,122,566 A * | 9/2000 | Nguyen et al. | 700/218 |
| 6,673,255 B2 * | 1/2004 | Marxer et al. | 216/4 |
| 6,725,114 B1 * | 4/2004 | Jevtic | 700/100 |
| 6,977,014 B1 | 12/2005 | Stevens et al. | |
| 7,210,246 B2 * | 5/2007 | van der Meulen | 34/467 |
| 8,034,182 B2 | 10/2011 | Yamazaki et al. | |
| 2002/0173868 A1 * | 11/2002 | Mukuta et al. | 700/100 |
| 2003/0131458 A1 * | 7/2003 | Wang et al. | 29/25.01 |
| 2004/0035360 A1 | 2/2004 | Yamazaki et al. | |
| 2004/0123804 A1 * | 7/2004 | Yamazaki et al. | 118/723 VE |
| 2005/0005848 A1 * | 1/2005 | Yamazaki et al. | 118/719 |
| 2005/0239294 A1 * | 10/2005 | Rosenblum et al. | 438/778 |
| 2006/0102078 A1 * | 5/2006 | Fairbairn et al. | 118/719 |
| 2007/0107845 A1 * | 5/2007 | Ishizawa et al. | 156/345.32 |
| 2007/0238054 A1 * | 10/2007 | Kok et al. | 430/317 |
| 2008/0014055 A1 * | 1/2008 | van der Meulen | 414/173 |
| 2008/0057221 A1 * | 3/2008 | Boyd et al. | 427/569 |
| 2008/0085173 A1 * | 4/2008 | van der Meulen | 414/222.07 |
| 2008/0232948 A1 * | 9/2008 | van der Meulen et al. | 414/805 |
| 2009/0016853 A1 * | 1/2009 | Yoo | 414/147 |
| 2009/0035101 A1 * | 2/2009 | Zimmerhackl et al. | 414/222.01 |
| 2009/0035102 A1 * | 2/2009 | Zimmerhackl et al. | 414/222.04 |
| 2009/0304907 A1 * | 12/2009 | Koparal | 427/58 |
| 2010/0009535 A1 * | 1/2010 | Dordi et al. | 438/687 |
| 2010/0168892 A1 * | 7/2010 | Schmidt | 700/100 |
| 2010/0193132 A1 * | 8/2010 | Wi et al. | 156/345.51 |
| 2010/0215460 A1 * | 8/2010 | Watanabe et al. | 414/217 |
| 2010/0232914 A1 * | 9/2010 | Adhikari et al. | 414/222.02 |
| 2010/0239394 A1 * | 9/2010 | Watanabe et al. | 414/217 |
| 2011/0132260 A1 * | 6/2011 | Yamazaki et al. | 118/719 |
| 2011/0142573 A1 * | 6/2011 | Blonigan et al. | 414/217 |

FOREIGN PATENT DOCUMENTS

| | | | |
|---|---|---|---|
| JP | 2003163082 A | * | 6/2003 |
| JP | 2004-47452 A | | 2/2004 |
| JP | 2004-327272 A | | 11/2004 |

* cited by examiner

SUBSTRATE PROCESSING APPARATUS

CROSS-REFERENCE TO RELATED PATENT APPLICATIONS

This application claims priority to and the benefit of Korean Patent Application No. 10-2012-0096784, filed on Aug. 31, 2012 in the Korean Intellectual Property Office, the entire content of which is incorporated herein by reference.

BACKGROUND

1. Field

Aspects of embodiments of the present invention relate to a substrate processing apparatus.

2. Description of the Related Art

In general, in the semiconductor and flat display equipment manufacturing fields, several discontinuous and different processes are performed on a substrate until a product is finally completed. In order to maximize the efficiency of these processes, several discontinuous and differently numbered process stations are arranged in a line to constitute a continuous production line. The substrate is carried along the production line via an automatic device so that the different processes can be continuously performed on the substrate. However, when one process station stops due to, for example, trouble or an operating error, the whole production line stops. One way to address this problem is to arrange several production lines in parallel.

FIG. 1 illustrates a cluster tool according to the related art. The cluster tool includes a central chamber T that transfers a substrate to different process chambers and to same process stations that are arranged around the central chamber T in a parallel manner (for example, on both sides of the central chamber T as divided by a line between stations 1 and 2). Thus, the whole production line may operate continuously even when any one process station stops so that productivity may be improved. However, in the cluster tool of FIG. 1, when two different types of processes are performed in different atmospheres, the efficiency of the processes may be lowered. For example, when a first process in chambers A, B, and F is performed in a vacuum atmosphere and a second process in chambers C, D, and E is performed under atmospheric pressure, if a substrate on which the first process has been performed is carried out of one of the chambers A, B, and F, the central chamber T needs to be in a vacuum state. Subsequently, when the substrate is transferred to one of the chambers C, D, and E, the state of the central chamber T should be changed to atmospheric pressure and thus, the overall process efficiency may be lowered.

SUMMARY

One or more embodiments of the present invention provide for a substrate processing apparatus that may improve the efficiency of processing a substrate and may reduce an area or length in which the substrate processing apparatus is installed.

According to an exemplary embodiment of the present invention, a substrate processing apparatus is provided. The substrate processing apparatus includes a first process unit including a plurality of first process stations configured to perform a first process in a first atmosphere, a second process unit including a plurality of second process stations configured to perform a second process in a second atmosphere different from the first atmosphere, and a transformation unit between the first process unit and the second process unit. The first process unit, the transformation unit, and the second process unit are arranged in a line. The transformation unit includes a plurality of transformation stations configured to transform an atmosphere between the first atmosphere and the second atmosphere.

The transformation stations may be arranged on both sides of the line.

Each of the transformation stations may be configured to accommodate and process a plurality of substrates concurrently.

A ratio of a number of the second process stations to a number of the first process stations may be proportional to a ratio of a process time of the second process to a process time of the first process.

The first process stations may be arranged on both sides of the line.

The first process unit may further include a central transfer chamber. The first process stations may be around the central transfer chamber.

The central transfer chamber may include a transfer mechanism.

The second process stations may be arranged on both sides of the line.

The second process unit may further include a second central transfer chamber. The second process stations may be around the second central transfer chamber.

The substrate processing apparatus may further include a first transfer unit between the first process unit and the transformation unit, and a second transfer unit between the transformation unit and the second process unit.

The first transfer unit may be configured to maintain the first atmosphere.

The second transfer unit may be configured to maintain the second atmosphere.

The first process may be different from the second process.

The first atmosphere may be a vacuum atmosphere. The second atmosphere may be an atmospheric pressure atmosphere.

The first process may be a physical vapor deposition (PVD) process or a chemical vapor deposition (CVD) process.

The first process may be an etching process.

The second process may be one selected from the group consisting of ink-jet printing, screen printing, and transfer printing.

The first process unit, the transformation unit, and the second process unit may be repeatedly arranged.

The substrate processing apparatus may further include a second transformation unit connected to the second process unit and configured to transform the second atmosphere into an atmosphere different from the second atmosphere.

The substrate processing apparatus may further include a third transformation unit connected to the first process unit and configured to transform a current atmosphere into the first atmosphere.

BRIEF DESCRIPTION OF THE DRAWINGS

The above and other features and aspects of the present invention will become more apparent by describing in detail exemplary embodiments thereof with reference to the attached drawings in which:

FIG. 4, which includes

DETAILED DESCRIPTION

Elements in the following drawings may be exaggerated, omitted, or schematically illustrated for convenience and clarity of explanation, and the sizes of elements do not necessarily reflect their actual sizes. In addition, in the description of elements, it will be understood that when an element or layer is referred to as being "on" or "under" another element or layer, the element or layer can be directly on or under another element or layer, or directly on or under intervening elements or layers. Further, criteria for "on" and "under" will be provided based on the drawings. Exemplary embodiments of the present invention will now be described more fully with reference to the accompanying drawings.

Figure 1:
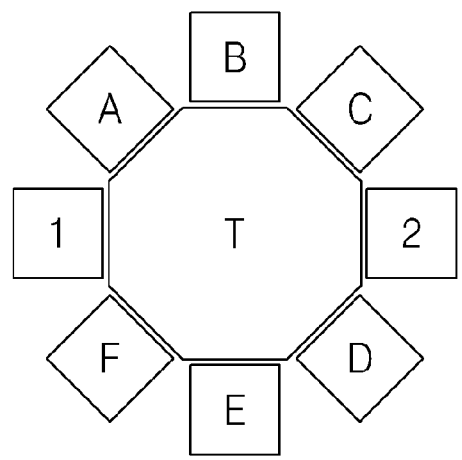
FIG. 1 is a schematic view of a cluster tool according to the related art.
Figure 2:
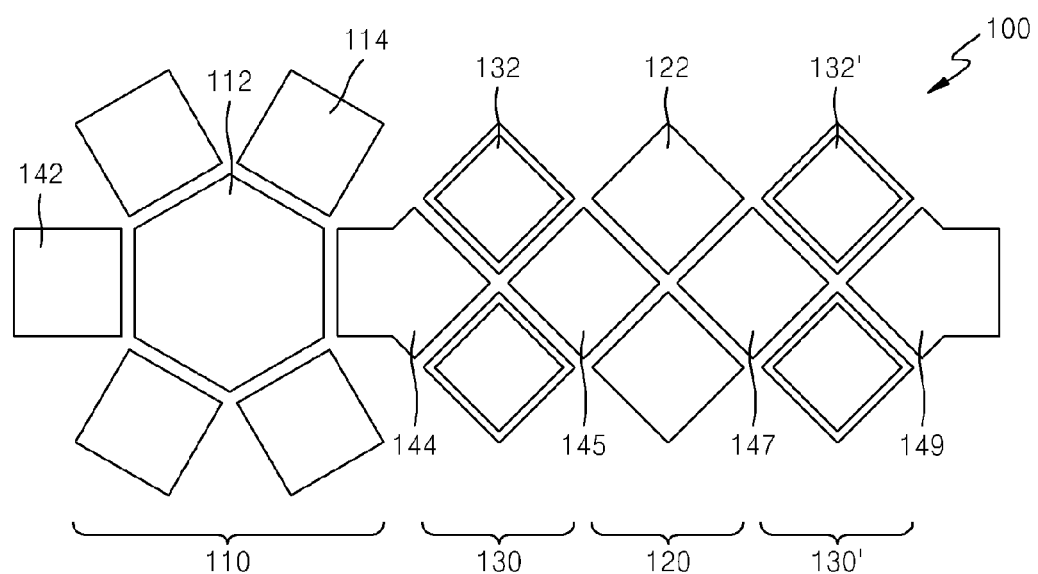
FIG. 2 is a schematic view of a substrate processing apparatus according to an embodiment of the present invention.
Figure 3:
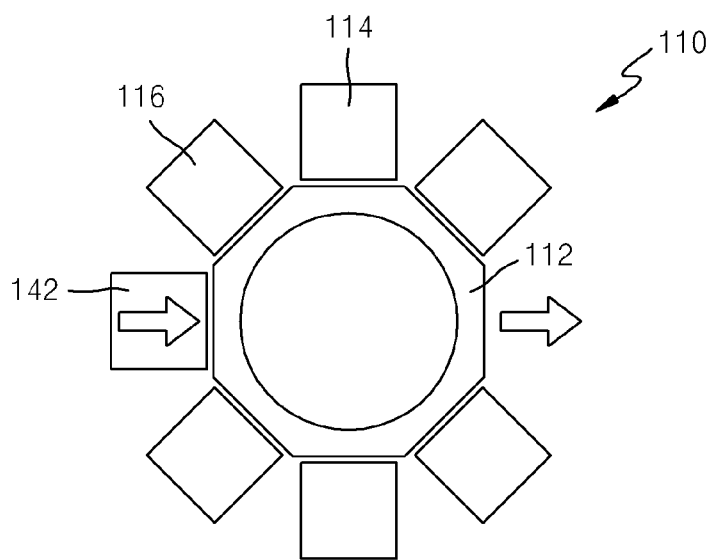
FIG. 3 is a schematic view of a first process unit of the substrate processing apparatus illustrated in FIG. 2.

FIG. 2 is a schematic view of a substrate processing apparatus 100 according to an embodiment of the present invention. FIG. 3 is a schematic view of a first process unit 110 of the substrate processing apparatus 100 illustrated in FIG. 2. FIG. 4 is an example timing diagram of the substrate processing apparatus 100 of FIG. 2.

Referring to FIG. 2, the substrate processing apparatus 100 includes the first process unit 110 including a plurality of first process stations 114, a second process unit 120 including a plurality of second process stations 122, and a first transformation unit 130 disposed between the first process unit 110 and the second process unit 120. The first process unit 110, the first transformation unit 130, and the second process unit 120 are arranged in a line. A substrate may undergo a series of continuous processes while passing through the first process unit 110 and the second process unit 120.

The first process unit 110 includes a plurality of first process stations 114 that perform a first process in a first atmosphere. The first process stations 114 may be arranged in parallel (for example, on both sides of the first process unit 110 as divided by a line between the first process unit 110 and the second process unit 120 that bisects the first process unit 110, the second process unit 120, and the first transformation unit 130) and may perform the same process concurrently (e.g., simultaneously) or sequentially. For example, the first atmosphere may be a vacuum atmosphere, and the first process may be a deposition process, such as a physical vapor deposition (PVD) process or a chemical vapor deposition (CVD) process, which is performed in the vacuum atmosphere. In addition, the first process may be an etching process performed in the vacuum atmosphere. However, the first atmosphere and the first process are not limited thereto, and in other embodiments, the first process unit 110 may perform various processes in various environments.

As illustrated in FIG. 3, the first process unit 110 may further include a central transfer chamber 112, and the first process stations 114 of the first process unit 110 may be disposed around the central transfer chamber 112 (for example, in a concentric manner). For example, the first process unit 110 may be a cluster tool. In addition, the first process unit 110 may further include a stock chamber 116 that provides and stores masks used in forming patterns on the substrate.

A vacuum system for forming a vacuum or near vacuum state for a first atmosphere (for example, a vacuum atmosphere) may be installed at or near the central transfer chamber 112. The vacuum system may be disposed on each of the first process stations 114.

In addition, a transfer mechanism for transferring the substrate, which is carried to the transfer mechanism via a carrying module 142, may be installed in the central transfer chamber 112. The transfer mechanism may be, for example, a robot arm that transfers the substrate in a programmed sequence. For example, the transfer mechanism may transfer the substrate (that is carried into the central transfer chamber 112) to one or more of the first process stations 114 sequentially at a set time interval (for example, a predetermined time interval), and may transfer the substrate on which the first process has been completed to one or more second process stations 122 (see FIG. 2).

Referring back to FIG. 2, the second process unit 120 includes a plurality of second process stations 122 that perform a second process in a second atmosphere. The second process stations 122 are arranged in parallel (for example, on both sides of a line between the first process unit 110 and the second process unit 120 that bisects the first process unit 110 and the second process unit 120) and may perform the same second process at the same time or sequentially.

The second process differs from the first process performed by the first process unit 110 in that the second process takes place in a different atmosphere from the first atmosphere of the first process unit 110. For example, the second atmosphere may be an atmosphere such as an inert gas—e.g., nitrogen (N)—atmosphere under an atmospheric pressure or the like, and the second process may be one selected from the group consisting of ink-jet printing, screen printing, and transfer printing. However, the second atmosphere and the second process are not limited thereto, and in other embodiments, the second process unit 120 may perform various processes in various atmospheres.

Since the first process performed by the first process unit 110 and the second process performed by the second process unit 120 are different from each other, a first process time for performing the first process and a second process time for performing the second process may be different from each other. For example, the first process time may be longer than the second process time, in which case the second process unit 120 may wait on the first process unit 110 when processing the substrates (e.g., in an assembly line fashion) from the first process unit 110 to the second process unit 120 or from the second process unit 120 to the first process unit 110. Thus, the efficiency of processing multiple substrates with the substrate processing apparatus 100 may be lowered.

In order to improve the efficiency of the substrate processing apparatus 100, the ratio of the number of second process stations 122 to the number of first process stations 114 may be in inverse proportion to the ratio of the process speed of the second process to the process speed of the first process (or may be in direct proportion to the ratio of the process time of the second process to the process time of the first process). Here, the process speed indicates the number of substrates that may be processed per unit time. For example, when the first process time is twice the second process time, the number of first process stations 114 is set to twice the number of second process stations 122 so that the first process unit 110 and the second process unit 120 process the same number of substrates in the same period of time and the efficiency of the substrate processing apparatus 100 may be improved.

In addition, since the first process and the second process are performed in different atmospheres, the first transformation unit 130 is located between the first process unit 110 and the second process unit 120. The first transformation unit 130 smoothly transforms between the first atmosphere and the second atmosphere to allow the first process unit 110 and the second process unit 120 to smoothly perform their respective processes.

In the exemplary embodiment of FIG. 2, the first transformation unit 130 includes a plurality of first transformation stations 132 that are arranged in parallel (for example, on both sides of a line between the first process unit 110 and the first transformation unit 130 that bisects the first process unit 110 and the first transformation unit 130). Each of the first transformation stations 132 may transform between the first atmosphere and the second atmosphere. Thus, the first process unit 110 and the second process unit 120 may maintain different atmospheres (and neither atmospheres have to be changed).

With multiple first transformation stations 132, when one substrate is accommodated in one first transformation station 132, another substrate may be accommodated in another first transformation station 132. In another embodiment, each of the first transformation stations 132 may accommodate two or more substrates at the same time (for example, concurrently or simultaneously).

Thus, when several substrates are sequentially processed by a series of processes, the first transformation unit 130 transforms the atmosphere between the processes to accommodate the substrates. Thus, a time required for transforming the atmosphere may be reduced compared to transforming the atmosphere one substrate at a time. As a result, yield may be improved. In addition, since the time required for transforming the atmosphere is reduced in this way, atmosphere transformation does not need to be quickly performed (which can lead to the generation of undesired particles) to improve a yield.

As described above, since the first process stations 114, the second process stations 122, and the first transformation stations 132 are arranged in parallel (for example, on both sides of a line between the first process unit 110 and the second process unit 120 that bisects the first process unit 110, the first transformation unit 130, and the second process unit 120), an area or length in which the substrate processing apparatus 100 is installed may be reduced.

The first transformation unit 130 is connected to the first process unit 110 by a first transfer unit 144 and is connected to the second process unit 120 by a second transfer unit 145. In one embodiment, the first transfer unit 144 maintains the first atmosphere that is the same as the atmosphere of the first process unit 110, and the second transfer unit 145 maintains the second atmosphere that is the same as the atmosphere of the second process unit 120 so that the substrate may be smoothly transferred.

In the exemplary embodiment of FIG. 2, a third transfer unit 147 that transfers the substrate on which the second process has been performed, and a second transformation unit 130' that transforms the second atmosphere required in the second process unit 120 into a different atmosphere from the second atmosphere, are connected to the second process unit 120. The third transfer unit 147 transfers the substrate to the second transformation unit 130' and may concurrently (for example, simultaneously) perform a process, such as a thermal treatment or the like, on the substrate on which the second process, such as ink-jet printing or the like, has been performed. That is, since the third transfer unit 147 may be used as a thermal treatment chamber or the like, the process efficiency of the substrate processing apparatus 100 may be improved.

In the exemplary embodiment of FIG. 2, the second transformation unit 130' includes a plurality of second transformation stations 132'. The second transformation stations 132' are arranged in parallel (for example, on both sides of a line extending from the first process unit 110 to the second transformation unit 130' that bisects the first process unit 110, the first transformation unit 130, the second process unit 120, and the second transformation unit 130').

In one exemplary embodiment, after the second process unit 120 completes processing the substrate, the second transformation unit 130' transforms the second atmosphere to a different atmospheric state (such as a standard atmosphere), and a carrying-out module 149 carries the substrate out of the substrate processing apparatus 100. In another embodiment, when further processing the substrate is desired, the second transformation unit 130' transforms the atmosphere into an atmosphere required in a subsequent processing operation. In this case, the carrying-out module 149 may function as another transfer unit.

Figure 4A:
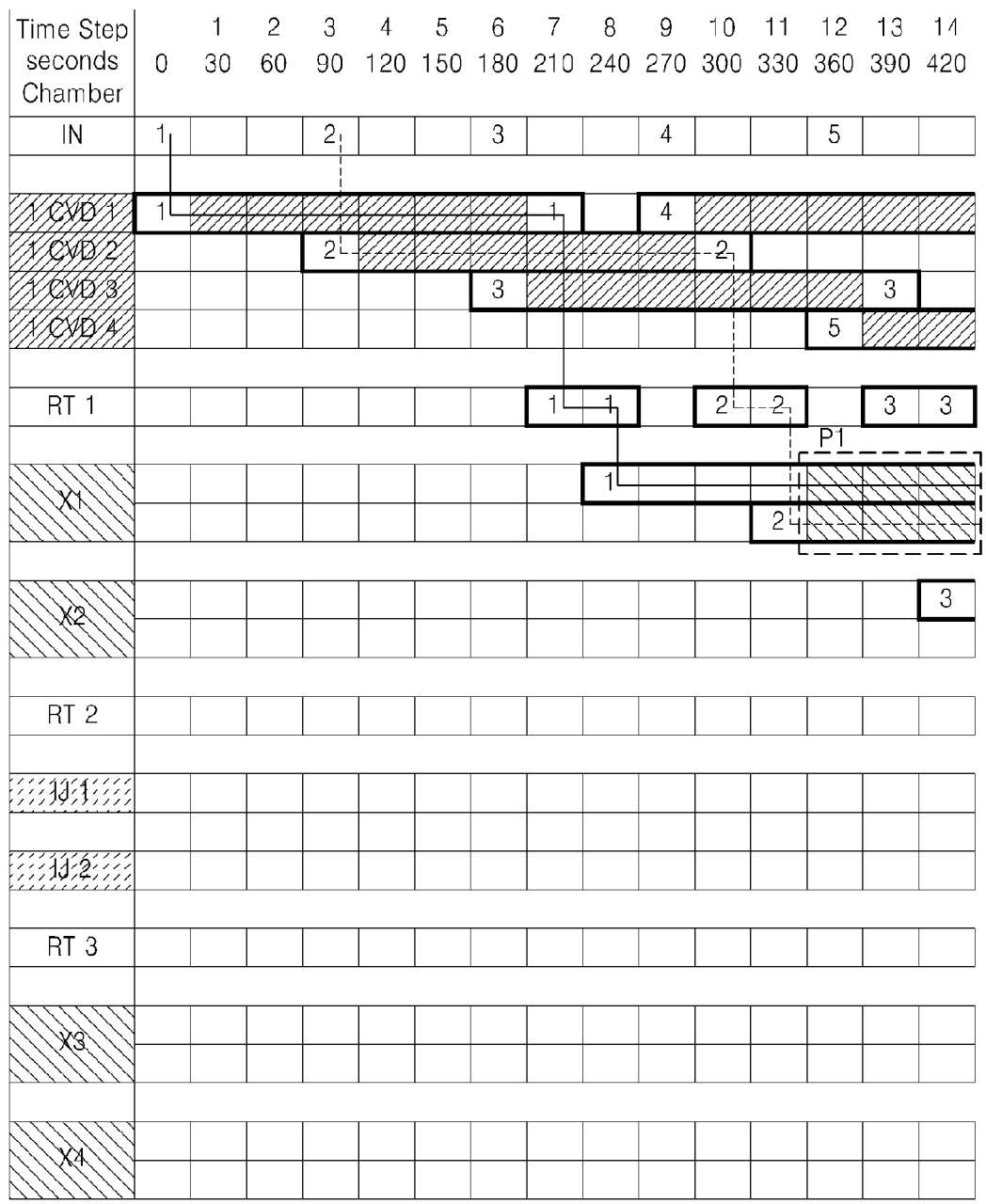
FIGS. 4A and 4B, is a timing diagram of the substrate processing apparatus of FIG. 2 according to an exemplary embodiment of the present invention.
Figure 4B:
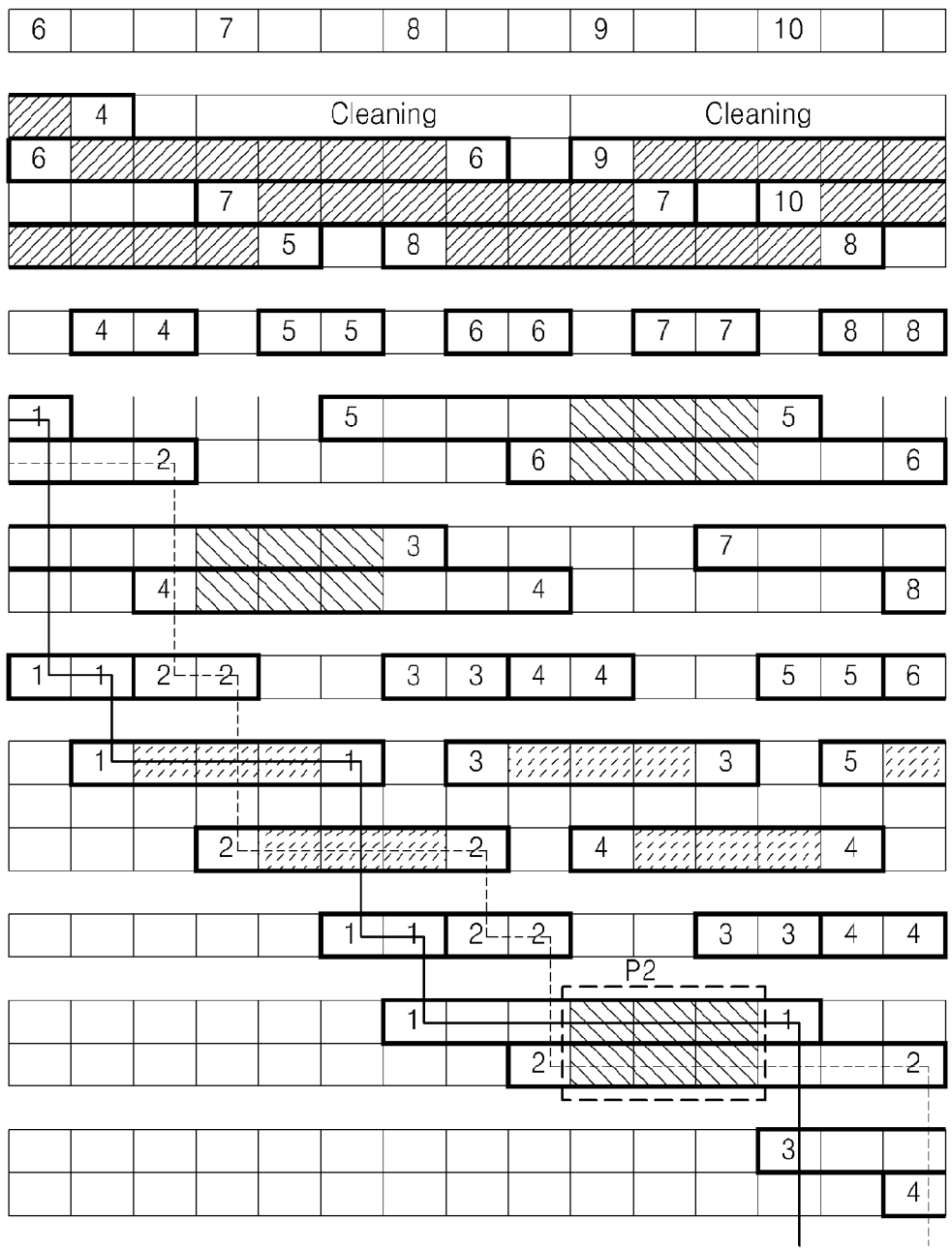

FIG. 4, which includes FIGS. 4A and 4B, is a timing diagram of the substrate processing apparatus 100 of FIG. 2 according to an exemplary embodiment of the present invention. An example operation of the substrate processing apparatus 100 of FIG. 2 will now be described with reference to FIGS. 2 and 4.

The first process unit 110 includes four first process stations 114 (referred to as 1CVD1, 1CVD2, 1CVD3, and 1CVD4 in FIG. 4) that perform CVD in a vacuum state, the second process unit 120 includes two second process stations 122 (referred to as IJ1 and IJ2 in FIG. 4) that perform ink-jet printing in an atmospheric nitrogen atmosphere, the first transformation unit 130 includes two first transformation stations 132 (referred to as X1 and X2 in FIG. 4) that may each concurrently (e.g., simultaneously) accommodate two substrates, and the second transformation unit 130' includes two second transformation stations 132' (referred to as X3 and X4 in FIG. 4) that may each concurrently (e.g., simultaneously) accommodate two substrates. In addition, in FIG. 4, the carrying module 142 is referred to as IN, the first transfer unit 144 is referred to as RT1, the second transfer unit 145 is referred to as RT2, the third transfer unit 147 is referred to as RT3, the individual substrates being processed are referred to as 1, 2, 3, ..., 10 and time is measured in time steps 0, 1, 2, ..., 29 corresponding to 0, 30, 60, ..., 870 seconds, respectively.

In further detail with reference to FIG. 4, in time step 0 (that is, 0 seconds), a first substrate 1 is carried from the carrying module IN to a (first) first process station 1CVD1 in which a CVD process is performed, then transferred in time steps 7-8 to a (first) first transformation station X1 by the first transfer unit RT1. While the CVD process is performed on the first substrate 1 during time steps 1-6 in the (first) first process station 1CVD1, a second substrate 2 is carried in time step 3 (that is, 90 seconds) from the carrying module IN to a (second) first process station 1CVD2 with a set time difference (for example, a predetermined time difference, in this case 90 seconds) between the second substrate 2 and the first substrate 1. As shown in the exemplary embodiment of FIG. 4, the difference in time between when the first substrate 1 is carried to the (first) first process station 1CVD1 and the second substrate 2 is carried to the (second) first process station 1CVD2 is 90 seconds (that is, 3 time steps).

The first substrate 1 that is transferred to the (first) first transformation station X1 by the first transfer unit RT1 is in a standby state from time step 9 until time step 11 when the second substrate 2 is transferred to the (first) first transformation station X1 by the first transfer unit RT1. After the second substrate 2 is transferred to the (first) first transformation station X1, the first substrate 1 and the second substrate 2 are concurrently (e.g., simultaneously) accommodated in the (first) first transformation station X1 in time steps 12-14 as indicated by region P1 of FIG. 4. During this time, the (first) first transformation station X1 transforms an environment inside the (first) first transformation station X1 from a vacuum state to the nitrogen atmosphere of the second process unit 120.

Subsequently, the first substrate 1 is transferred in time steps 15-16 to a (first) second process station IJ1 by the second transfer unit RT2. After transfer of the first substrate 1 has been completed, the second substrate 2 is transferred to a (second) second process station IJ2 by the second transfer unit RT2.

The first substrate 1 on which an ink-jet printing process is performed during time steps 17-19 in the (first) second process station IJ1 is transferred in time steps 20-21 to a (first) second transformation station X3 by the third transfer unit RT3. The first substrate 1 then waits in a standby state until the second substrate 2 is transferred to the (first) second transformation station X3. When the second substrate 2 is transferred to the (first) second transformation station X3 in time steps 22-23 by the third transfer unit RT3, the first substrate 1 and the second substrate 2 are concurrently (e.g., simultaneously) accommodated in the (first) second transformation station X3 as indicated by P2 of FIG. 4. The (first) second transformation station X3 then transforms an environment inside the (first) second transformation station X3 during time steps 24-26 from a nitrogen atmosphere to a different atmospheric state.

While the first substrate 1 and the second substrate 2 are transferred by the third transfer unit RT3, a process, such as a thermal treatment process or the like, may be additionally performed on the first substrate 1 and the second substrate 2. That is, since the third transfer unit RT3 may be used as a thermal treatment chamber or the like, the process efficiency of the substrate processing apparatus 100 may be improved.

In this way, the first substrate 1 and the second substrate 2 on which a series of continuous processes have been performed, may be carried out of the substrate processing apparatus 100 via the carrying-out module 149. The difference in time between when the first substrate 1 is carried out of the (first) second process station IJ1 and when the second substrate 2 is carried out of the (second) second process station IJ2 is 60 seconds, which is a reduced time difference compared to the time difference of 90 seconds.

The reason why 90 seconds, which is the difference in time between when the first substrate 1 is carried into (or out of) the (first) first process station 1CVD1 and when the second substrate 2 is carried into (or out of) the (second) first process station 1CVD2, is reduced to 60 seconds, which is the difference in time between when the first substrate 1 is carried into (or out of) the (first) second process station IJ1 and when the second substrate 2 is carried into (or out of) the (second) second process station IJ2, is that the (first) first transformation station X1 and the (first) second transformation station X3 transform respective atmospheres inside the first transformation station X1 and the first transformation station X3 when the first substrate 1 and the second substrate 2 are concurrently (e.g., simultaneously) accommodated in the first transformation station X1 or the first transformation station X3. Thus, by concurrently (e.g., simultaneously) accommodating multiple substrates in a single transformation station, the entire atmosphere transforming time is reduced compared to transforming the atmosphere one substrate at a time and without having to perform quick atmosphere transformation. Accordingly, particles may be prevented from being generated during atmosphere transformation that would otherwise be generated using quick atmosphere transformation.

In addition, as may also be seen from FIG. 4, when the (first) first transformation station X1 and a (second) first transformation station X2 perform an atmosphere transforming process concurrently (for example, simultaneously) and the (first) second transformation station X3 and a (second) second transformation station X4 perform an atmosphere transforming process concurrently (for example, simultaneously), the speed of the atmosphere transforming process on the overall substrate processing may be further increased. Thus, the yield and efficiency of the substrate processing apparatus 100 may be further improved.

Figure 5:
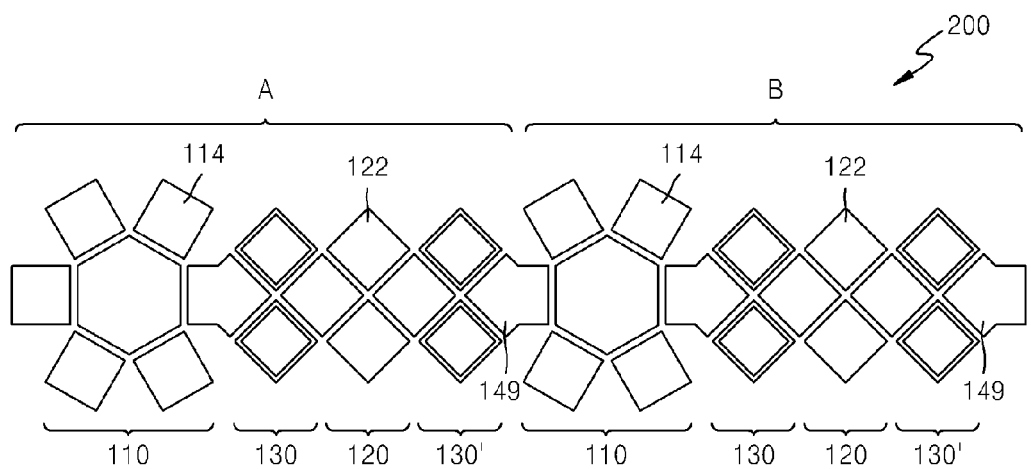
FIG. 5 is a view of a modified example of the substrate processing apparatus of FIG. 2.

FIG. 5 is a view of a substrate processing apparatus 200 according to a modified example of the substrate processing apparatus 100 of FIG. 2.

In the substrate processing apparatus 200 of FIG. 5, a first substrate processing apparatus A and a second substrate processing apparatus B that are substantially the same as the substrate processing apparatus (see the substrate processing apparatus 100 of FIG. 2), are continuously connected to each other. Each of the first substrate processing apparatus A and the second substrate processing apparatus B includes a first process unit 110 including a plurality of first process stations 114, a second process unit 120 including a plurality of second process stations 122, and a first transformation unit 130 disposed between the first process unit 110 and the second process unit 120. The first process unit 110, the first transformation unit 130, and the second process unit 120 are substantially the same as those of FIGS. 2 through 4 and thus, detailed descriptions thereof will not be repeated.

Referring to FIG. 5, a second transformation unit 130' of the first substrate processing apparatus A transforms an atmosphere of the second process unit 120 of the first substrate processing apparatus A into an atmosphere of the first process unit 110 of the second substrate processing apparatus B. A substrate may be transferred to the first process unit 110 of the second substrate processing apparatus B via a carrying-out module 149 of the first substrate processing apparatus A that functions as another transfer unit. In this case, a carrying module (see, for example, the carrying module 142 of FIG. 2) may be omitted from the first process unit 110 of the second substrate processing apparatus B.

When processing of the substrate is completed while passing through the second substrate processing apparatus B, the second transformation unit 130' of the second substrate processing apparatus B may transform the second atmosphere of the second process unit 120 of the second substrate processing apparatus B to a different atmospheric state (for example, a standard atmosphere). Further, the substrate may be carried out of the second substrate processing apparatus B via the carrying-out module 149 of the second substrate processing apparatus B.

In FIG. 5, the first process unit 110 and the second process unit 120 are repeatedly connected to each other. However, the present invention is limited thereto. For example, in other embodiments, various process units for performing various processes required to process the substrate may be continuously connected to one another in a line.

Figure 6:
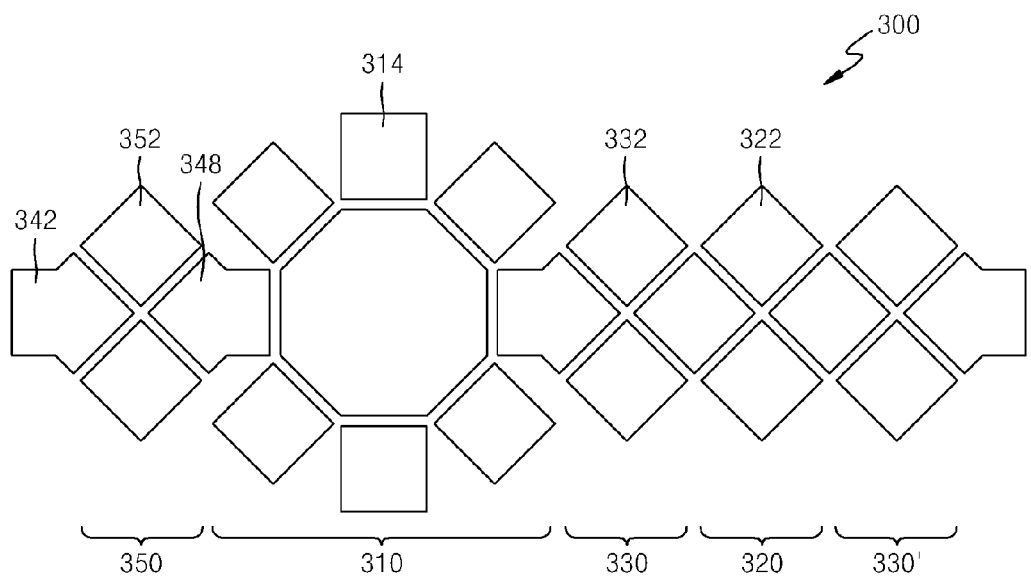
FIG. 6 is a schematic view of a substrate processing apparatus according to another embodiment of the present invention.

FIG. 6 is a schematic view of a substrate processing apparatus 300 according to another embodiment of the present invention.

Referring to FIG. 6, the substrate processing apparatus 300 includes a first process unit 310, a second process unit 320, and a first transformation unit 330 arranged in a line with the first transformation unit 330 between the first process unit 310 and the second process unit 320. The first process unit 310 includes a plurality of first process stations 314 that are arranged in parallel (for example, on both sides of the first process unit 310 as divided by a line between the first process unit 310 and the second process unit 320 that bisects the first process unit 310, the second process unit 320, and the first transformation unit 330). The second process unit 320 includes a plurality of second process stations 322 that are arranged in parallel (for example, on both sides of the second process unit 310 as divided by the line between the first process unit 310 and the second process unit 320). The first transformation unit 330 includes a plurality of first transformation stations 332 that are arranged in parallel (for example, on both sides of the first transformation unit 330 as divided by the line between the first process unit 310 and the second process unit 320).

In addition, the second process unit 320 may further include a third transfer unit 347 that transfers a substrate on which a second process has been completed, and a second transformation unit 330' that transforms the second atmosphere required by the second process unit 320 into an atmosphere that is different from the second atmosphere (for example, into a standard atmosphere). The first process unit 310, the first transformation unit 330, the second process unit 320, and the second transformation unit 330' are substantially the same as the first process unit 110, the first transformation unit 130, the second process unit 120, and the second transformation unit 130', respectively, of FIGS. 2 through 4. Thus, detailed descriptions of common features will not be repeated, and only differences therebetween will now be described.

FIG. 6 illustrates an embodiment where the ratio of a second process time to a first process time is 1:3 (that is, the first process time is three times as long as the second process time). Thus, the ratio of the number of second process stations 322 to the number of first process stations 314 is 1:3 in order to prevent (or reduce) lowering of the efficiency of the substrate processing apparatus 300.

In addition, the substrate processing apparatus 300 of FIG. 6 further includes a third transformation unit 350 connected to the first process unit 310. In one exemplary embodiment, the third transformation unit 350 transforms the current atmosphere into a first atmosphere of the first process unit 310 and is connected to the first process unit 310 via a fourth transfer unit 348. In addition, the third transformation unit 350 is connected to a carrying module 342 such that an external substrate may be carried into the third transformation unit 350 via the carrying module 342. In this way, when the substrate is carried into the first process unit 310 from the third transformation unit 350 via the carrying module 342, the first process unit 310 already constitutes a first atmosphere required in a first process and thus, the efficiency of the substrate processing apparatus 300 may be improved.

In the exemplary embodiment of FIG. 6, the third transformation unit 350 includes a plurality of third transformation stations 352 that are arranged in parallel (for example, on both sides of a line between the third transformation unit 350 and the second transformation unit 330' that bisects the first process unit 310 and the second process unit 320). In one exemplary embodiment, each of the third transformation stations 352 transforms the atmospheric state to the first atmosphere. In addition, each of the third transformation stations 352 may accommodate two or more substrates concurrently (e.g., simultaneously).

Figure 7:
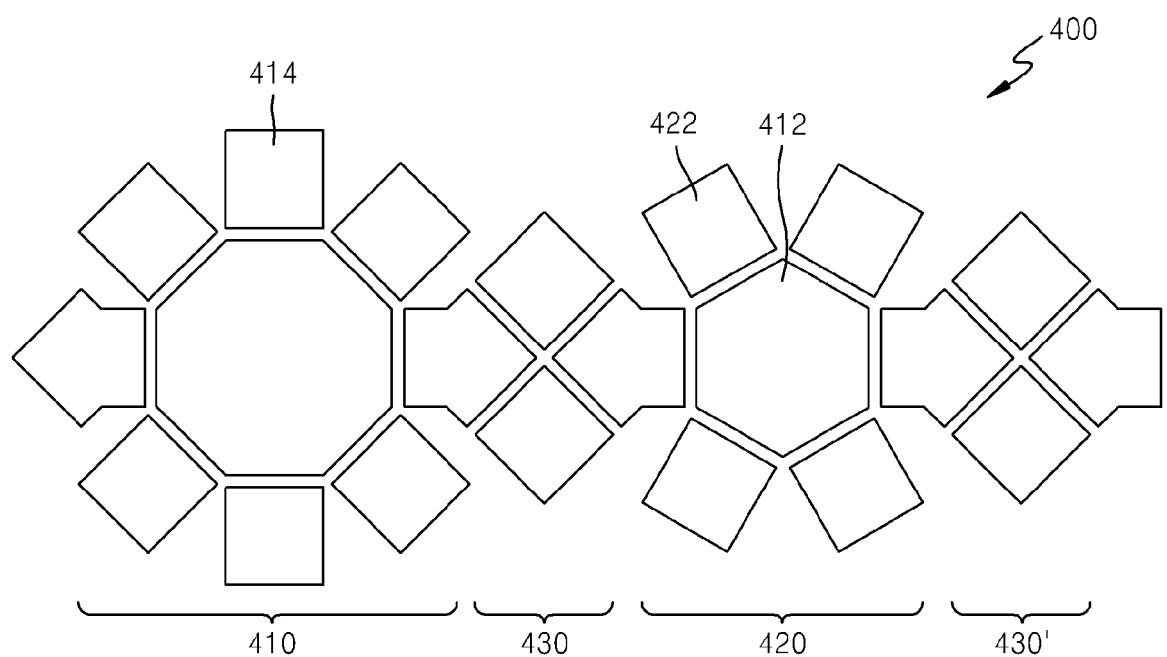
FIG. 7 is a schematic view of a substrate processing apparatus according to another embodiment of the present invention.

FIG. 7 is a schematic view of a substrate processing apparatus 400 according to another embodiment of the present invention.

Referring to FIG. 7, the substrate processing apparatus 400 includes a first process unit 410, a second process unit 420, a first transformation unit 430 disposed between the first process unit 410 and the second process unit 420, and a second transformation unit 430' connected to the second process unit 420 and that transforms the second atmosphere of the second process unit 420 into an atmosphere that is different from the second atmosphere (for example, into a standard atmosphere). The first process unit 410, the first transformation unit 430, and the second transformation unit 430' are substantially the same as the first process unit 110, the first transformation unit 130, and the second transformation unit 130', respectively, of FIGS. 2 through 4. Thus, detailed descriptions of common components will not be repeated, and only differences therebetween will now be described.

FIG. 7 illustrates an embodiment where the ratio of a second process time to a first process time is 2:3 (that is, the first process takes 50% longer than the second process). Thus, the ratio of the number of second process stations 422 to the number of first process stations 414 is 2:3 in order to prevent (or reduce) lowering of the efficiency of the substrate processing apparatus 400.

In the exemplary embodiment of FIG. 7, the second process unit 420 of the substrate processing apparatus 400 is a cluster tool. For example, the second process unit 420 includes a second central transfer chamber 412, with the second process stations 422 being disposed around the second central transfer chamber 412. In addition, the second process unit 420 may further include a stock chamber (see, for example, stock chamber 116 of FIG. 3) that provides and stores masks. In this way, the second process unit 420 includes a cluster tool as in the first process unit 410 so that the efficiency of the substrate processing apparatus 400 may be improved and the area (or length) in which the substrate processing apparatus 400 is installed may be further reduced.

According to embodiments of the present invention, the efficiency of processing a substrate may be improved, and the area or length in which a substrate processing apparatus is installed may be reduced. As described above, the structures of a substrate processing apparatus according to one or more embodiments of the present invention may not be limited thereto. For example, in other embodiments, the whole or parts of the above-described embodiments may be selectively combined to implement various modifications as would be apparent to one of ordinary skill.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A substrate processing apparatus arranged in a line from a first end to a second end and configured to process substrates, the substrate processing apparatus comprising:
   a first process unit configured to perform a first process on the substrates and comprising a plurality of first process stations each configured to sequentially perform the first process having a first process time on each substrate of a respective first portion of the substrates in a first atmosphere;
   a second process unit configured to perform a second process on the substrates and comprising a plurality of second process stations each configured to sequentially perform a second process having a second process time different from the first process time on each substrate of a respective second portion of the substrates in a second atmosphere different from the first atmosphere;

a transformation unit configured to transform an atmosphere of the substrates from the first atmosphere to the second atmosphere and comprising a plurality of transformation stations each configured to transform the atmosphere of each group of one or more substrates of a respective third portion of the substrates from the first atmosphere to the second atmosphere;

a carry-in unit configured to transfer each of the substrates from the first end to any one of the first process stations in the first atmosphere;

a first transfer unit configured to transfer each of the substrates from any one of the first process stations to any one of the transformation stations in the first atmosphere;

a second transfer unit configured to transfer each of the substrates from any one of the transformation stations to any one of the second process stations in the second atmosphere;

a carry-out unit configured to transfer each of the substrates from any one of the second process stations to the second end in the second atmosphere; and a control unit configured to control operation of the substrate processing apparatus by:
  dividing the substrates into their respective first portions, second portions, and third portions;
  controlling the carry-in unit to sequentially transfer the substrates from the first end to their respective first process stations in the first atmosphere;
  controlling the first process stations to concurrently perform the first process on the substrates among the first process stations in the first atmosphere;
  controlling the first transfer unit to sequentially transfer the substrates from the first process stations to their respective transformation stations in the first atmosphere;
  controlling the transformations stations to transform the atmosphere for the substrates from the first atmosphere to the second atmosphere;
  controlling the second transfer unit to sequentially transfer the substrates from the transformation stations to their respective second process stations in the second atmosphere;
  controlling the second process stations to concurrently perform the second process on the substrates among the second process stations in the second atmosphere; and
  controlling the carry-out unit to sequentially transfer the substrates from the second process stations to the second end in the second atmosphere, wherein the first process unit, the first transfer unit, the transformation unit, the second transfer unit, and the second process unit are arranged in the line from the first end to the second end, and wherein a ratio of a number of the first process stations to a number of the second process stations is substantially the same as a ratio of the first process time to the second process time.

2. The substrate processing apparatus of claim 1, wherein the transformation stations are arranged on both sides of the line.

3. The substrate processing apparatus of claim 1, wherein each of the transformation stations is configured to accommodate and process a plurality of the substrates concurrently.

4. The substrate processing apparatus of claim 1, wherein the first process stations are arranged on both sides of the line.

5. The substrate processing apparatus of claim 1, wherein
the first process unit further comprises a central transfer chamber, and
the first process stations are around the central transfer chamber.

6. The substrate processing apparatus of claim 5, wherein the central transfer chamber comprises a transfer mechanism.

7. The substrate processing apparatus of claim 1, wherein the second process stations are arranged on both sides of the line.

8. The substrate processing apparatus of claim 1, wherein
the second process unit further comprises a second central transfer chamber, and
the second process stations are around the second central transfer chamber.

9. The substrate processing apparatus of claim 1, wherein the first process is different from the second process.

10. The substrate processing apparatus of claim 1, wherein
the first atmosphere is a vacuum atmosphere, and
the second atmosphere is an atmospheric pressure atmosphere.

11. The substrate processing apparatus of claim 10, wherein the first process is a physical vapor deposition (PVD) process or a chemical vapor deposition (CVD) process.

12. The substrate processing apparatus of claim 10, wherein the first process is an etching process.

13. The substrate processing apparatus of claim 10, wherein the second process is one selected from the group consisting of ink-jet printing, screen printing, and transfer printing.

14. The substrate processing apparatus of claim 1, wherein the first process unit, the first transfer unit, the transformation unit, the second transfer unit, and the second process unit are repeatedly arranged.

15. The substrate processing apparatus of claim 1, further comprising a second transformation unit connected to the carry-out unit and configured to transform the second atmosphere into an atmosphere different from the second atmosphere.

16. The substrate processing apparatus of claim 1, further comprising a third transformation unit connected to the carry-in unit and configured to transform a current atmosphere into the first atmosphere.

* * * * *